United States Patent [19]

Yoshida

[11] Patent Number: 5,436,869
[45] Date of Patent: Jul. 25, 1995

[54] MEMORY CONTROLLER WHICH CAN CARRY OUT A HIGH SPEED ACCESS WHEN SUPPLIED WITH INPUT ADDRESSES WITH A TIME INTERVAL LEFT BETWEEN THE INPUT ADDRESSES HAVING THE SAME ROW ADDRESS

[75] Inventor: Kenichi Yoshida, Tokyo, Japan

[73] Assignee: NEC Corporation, Japan

[21] Appl. No.: 271,640

[22] Filed: Jul. 7, 1994

[30] Foreign Application Priority Data

Jul. 8, 1993 [JP] Japan .................................. 5-168819

[51] Int. Cl.⁶ .............................................. G11C 8/00
[52] U.S. Cl. ............................... 365/230.02; 365/233; 365/189.07; 365/230.08
[58] Field of Search ...................... 365/230.01, 230.02, 365/189.07, 189.02, 233, 238.5, 194, 191, 193, 230.08

[56] References Cited

U.S. PATENT DOCUMENTS

| | | | |
|---|---|---|---|
| 4,882,709 | 11/1989 | Wyland | 365/230.02 |
| 4,933,910 | 6/1990 | Olson et al. | 365/230.02 |
| 5,321,651 | 6/1994 | Monk | 365/230.02 |

*Primary Examiner*—Joseph A. Popek
*Attorney, Agent, or Firm*—Laff, Whitesel, Conte & Saret, Ltd.

[57] ABSTRACT

In a memory controller supplied with a first succession of first input addresses having a common row address and supplied with a second succession of second input addresses having the common row address with a time interval left between the first succession of input first addresses and the second succession of input second addresses, a coincidence detector produces a coincidence signal when a trailing row address of the row addresses of the first input addresses coincides with a leading row address of the row addresses of the second input addresses. When supplied with the coincidence signal, a timing controller already causes the multiplexer to deliver a third succession of a leading row address of the row addresses of the first input addresses and column addresses of the first input addresses to a memory device. The timing controller causes the multiplexer in response to the coincidence signal to deliver a fourth succession of column addresses of the second input addresses to the memory device with the time interval left between the third succession of the leading row addresses of the row addresses of the first input addresses and the column addresses of the first input addresses and the fourth succession of the column addresses of the second input addresses.

20 Claims, 7 Drawing Sheets

MEMORY CONTROLLER WHICH CAN CARRY OUT A HIGH SPEED ACCESS WHEN SUPPLIED WITH INPUT ADDRESSES WITH A TIME INTERVAL LEFT BETWEEN THE INPUT ADDRESSES HAVING THE SAME ROW ADDRESS

BACKGROUND OF THE INVENTION

This invention relates to a memory controller for controlling an access to a memory device which is typically a dynamic RAM (random access memory).

Various memory controllers are disclosed in Japanese Unexamined Patent Publications Nos. 61-42793 (42793/1986), 61-98996 (99996/1986), 62-149099 (149099/1987), 1-134544 (134544/1989), 1-158553 (158553/1989). As described in the Publications, either a high-speed page mode or a static column mode is used as a high-speed access mode in accessing a memory device of, for example, a dynamic RAM. Any one of the memory controllers controls the memory device in response to input addresses to access the memory device at the high-speed access mode. Each of the input addresses comprises a row address and a column address.

As will later be described, any one of the memory controllers can not access the memory device at a high speed when supplied with the input addresses with a time interval left between the input addresses having the same row address.

SUMMARY OF THE INVENTION

It is therefore an object of this invention to provide a memory controller which can access a memory device at a high speed when supplied with input addresses with a time interval left between the input addresses having the same row address.

Other objects of this invention will become clear as the description proceeds.

On describing the gist of an aspect of this invention, it is possible to understand that a memory controller is supplied with a first succession of first input addresses and supplied with a second succession of second input addresses with a time interval left between the first succession of the first input addresses and the second succession of the second input addresses. Each of the first and the second input addresses comprises a row address and a column address. The row addresses of the first input addresses are common in the first input addresses. The row addresses of the second input addresses are common in the second input addresses. The memory controller is for controlling a memory device in response to the first succession of the first input addresses and to the second succession of the second input addresses to access the memory device at a predetermined access mode.

According to the aspect of this invention, the above-understood memory controller comprises: an address receiver for receiving the first succession of the first input addresses and the second succession of the second input addresses in response to a first control signal to successively produce the first input addresses and the second input addresses; a coincidence detector connected to the address receiver for detecting coincidence between a trailing row address of the row addresses of the first input addresses and a leading row address of the row addresses of the second input addresses in response to a second control signal to produce a coincidence signal when the coincidence detector detects the coincidence; an address latch unit connected to the address receiver for temporarily memorizing the first input addresses and the second input addresses in response to a third control signal to successively produce the first input addresses and the second input addresses; an output address producer connected to the address latch unit for producing a third succession of a leading row address of the row addresses of the first input addresses and the column addresses of the first input addresses in response to a fourth control signal to deliver the third succession of the leading row address of the row addresses of the first input addresses and the column addresses of the first input addresses to the memory device as an output address signal; and a signal producer connected to the coincidence detector for producing the first through the fourth control signals and for producing, in response to the coincidence signal, a fifth control signal. The output address producer produces, in response to the fifth control signal, a fourth succession of the column addresses of the second input addresses to deliver the fourth succession of the column addresses of the second input addresses to the memory device as the output address signal with the time interval left between the third succession of the leading row address of the row addresses of the first input addresses and the column addresses of the first input addresses and the fourth succession of the column addresses of the second input addresses.

On describing the gist of a different aspect of this invention, it is possible to understand that a memory controller is supplied with a first succession of first input addresses and supplied with a second input address with a time interval left between the first succession of the first input addresses and the second input address. Each of the first and the second input addresses comprises a row address and a column address. The row addresses of the first input addresses are common in the first input addresses. The memory controller is for controlling a memory device in response to the first succession of the first input addresses and to the second input address to access the memory device at a predetermined access mode.

According to the different aspect of this invention, the above-understood memory controller comprises: an address receiver for receiving the first succession of the first input addresses and the second input address in response to a first control signal to successively produce the first input addresses and the second input address; a coincidence detector connected to the address receiver for detecting coincidence between a trailing row address of the row addresses of the first input addresses and the row address of the second input address in response to a second control signal to produce a coincidence signal when the coincidence detector detects the coincidence; an address latch unit connected to the address receiver for temporarily memorizing the first input addresses and the second input address in response to a third control signal to successively produce the first input addresses and the second input address; an output address producer connected to the address latch unit for producing a third succession of a leading row address of the row addresses of the first input addresses and the column addresses of the first input addresses in response to a fourth control signal to deliver the third succession of the leading row address of the row addresses of the first input addresses and the column addresses of the first input addresses to the memory device as an output address signal; and a signal producer connected to the coincidence detector for producing the first through the fourth control signals and for producing, in response to the coincidence signal, a fifth control signal. The output address producer produces, in response to the fifth control signal, the column address of the second input address to deliver the column address of the second input address to the memory device as the output address signal with the time interval left between the third succession of the leading row address of the row addresses of the first input addresses and the column addresses of the first input addresses and the column address of the second input address.

DESCRIPTION OF THE PREFERRED EMBODIMENT

Figure 1:
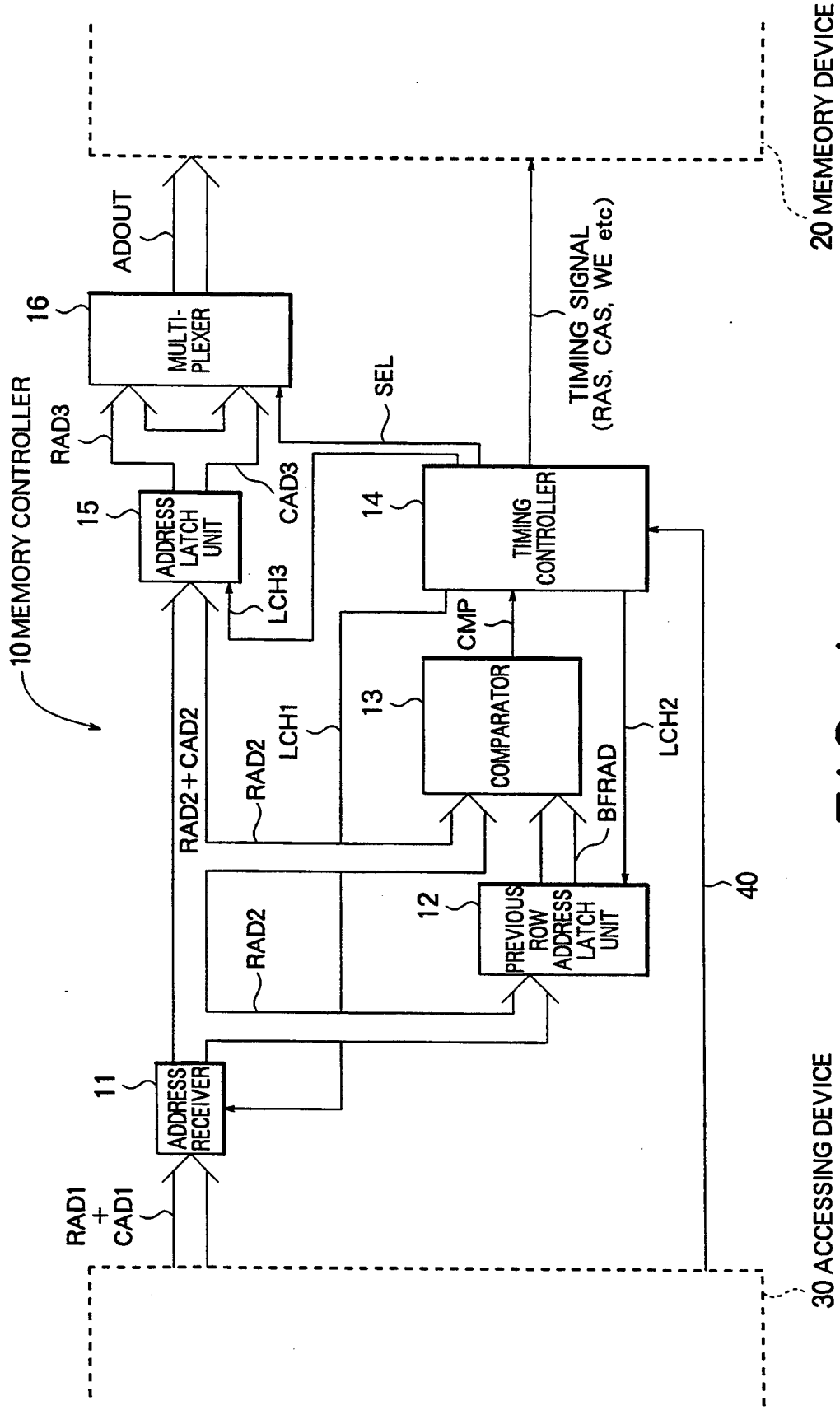
FIG. 1 is a block diagram of a memory controller according to an embodiment of this invention.

Referring to FIG. 1, a memory controller 10 according to a preferred embodiment of this invention is connected to an accessing device 30 through a row address bus RAD1 and a column address bus CAD1. The memory controller 10 is supplied with a first succession of first input addresses and supplied with a second succession of second input addresses through the row and the column address buses RAD1 and CAD1 from the accessing device 30 with a time interval left between the first succession of the first input addresses and the second succession of the second input addresses. Each of the first and the second input addresses comprises a row address and a column address.

Figure 2:
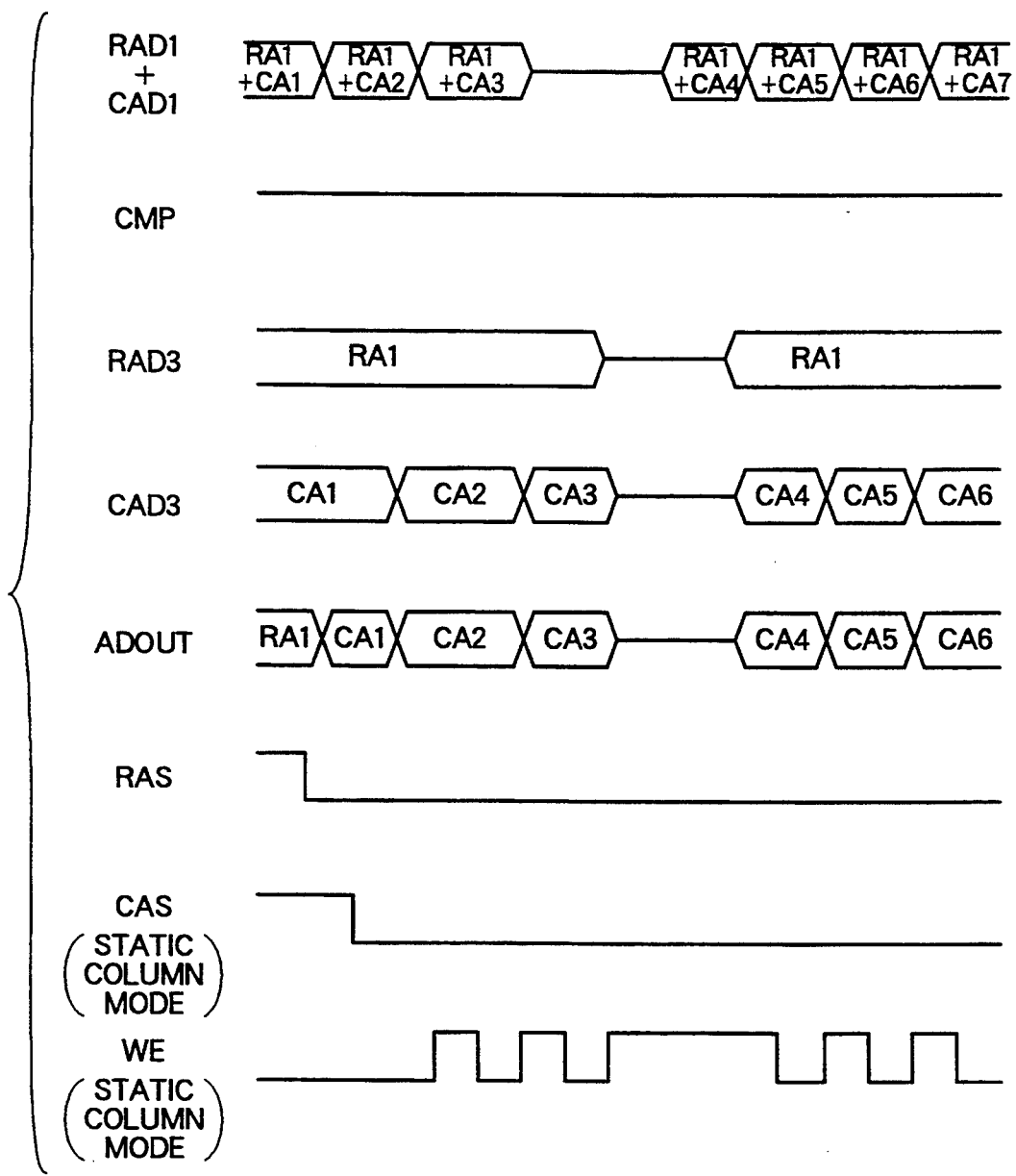
FIG. 2 is a time chart for use in describing operation of the memory controller illustrated in FIG. 1.

Turning to FIG. 2, the first and the second input addresses which are carried on the row and the column address buses RAD1 and CAD1, are illustrated along a top line. The illustrated first input addresses are equal to three in number. The illustrated second input addresses are equal to four in number. The row addresses of the first input addresses are labeled "RA1" and are common in the first input addresses. The column addresses of the first input addresses are labelled "CA1", "CA2", and "CA3" and are different from one another. The row addresses of the second input addresses are also labeled "RA1" and are common in the second input addresses. The row address RA1 of each of the second input addresses coincides with the row address RA1 of each of the first input addresses. The column addresses of the second input addresses are labeled "CA4", "CA5", "CA6", and "CA7" and are different from one another. As described above, the memory controller 10 (FIG. 1) is supplied with the first and the second input addresses with the time interval left between the first succession of the first input addresses and the second succession of the second input addresses.

Turning back to FIG. 1 with reference to FIG. 2 continued, the memory controller 10 is for controlling a memory device 20 in response to the first succession of the first input addresses and to the second succession of the second input addresses to access the memory device 20 at a static column mode. The memory device 20 is typically a dynamic RAM.

The memory controller 10 comprises an address receiver 11 which receives or latches the first succession of the first input addresses and the second succession of the second input addresses in response to a first address latch signal (or a first control signal) LCH1 and successively produces the first input addresses and the second input addresses. The row addresses RA1 of the first and the second input addresses are delivered from the address receiver 11 through row address buses RAD2 to a previous row address latch unit 12 and to a comparator 13. The first and the second input addresses are delivered from the address receiver 11 through a row address bus RAD2 and a column address bus CAD2 to an address latch unit 15.

The previous row address latch unit 12 memorizes or latches a trailing row address of the row addresses RA1 of the first input addresses as a previous row address BFRAD in response to a second address latch signal (or a second control signal) LCH2. The comparator 13 compares a leading row address of the row addresses RA1 of the second input addresses with the previous row address BFRAD and produces a coincidence signal of a high level as a compared result CMP when the leading row address of the row addresses RA1 of the second input addresses coincides with the previous row address BFRAD. The coincidence signal of a high level is illustrated along a second line in FIG. 2 as the compared result CMP.

Thus, a combination of the previous row address latch unit 12 and the comparator 13 serves as a coincidence detector connected to the address receiver 11. The coincidence detector (12 and 13) detects coincidence between the trailing row address of the row addresses RA1 of the first input addresses and the leading row address of the row addresses RA1 of the second input addresses in response to the second address latch signal (or the second control signal) LCH2 and produces the coincidence signal as the compared result CMP when the coincidence detector (12 and 13) detects the coincidence.

The address latch unit 15 temporarily latches or memorizes the first input addresses and the second input addresses in response to a third address latch signal (or a third control signal) LCH3 and successively produces the first input addresses and the second input addresses. The first input addresses and the second input addresses are delivered from the address latch unit 15 through a row address bus RAD3 and a column address bus CAD3 to a multiplexer 16. The first and the second input addresses which are carried on the row and the column address buses RAD3 and CAD3, are illustrated along third and fourth lines in FIG. 2. That is, the row addresses RA1 of the first and the second input addresses are delivered to the multiplexer 16 through the row address bus RAD3. The column addresses CA1, CA2, and CA3 of the first input addresses and the column addresses CA4, CA5, and CA6 of the second input addresses are delivered to the multiplexer 16 through the column address bus CAD3.

The multiplexer 16 is operable as an output address producer and selectively connects one of the row address bus RAD3 and the column address bus CAD3 to an output address bus ADOUT in response to a first selection signal (or a fourth control signal) which is received through a selection signal line SEL. In this event, the multiplexer 16 delivers to the memory device 20 through the output address bus ADOUT an output address signal which is illustrated in FIG. 2 along a fifth line. That is, the multiplexer 16 produces a third succession of a leading row address RA1 of the row addresses of the first input addresses and the column addresses CA1, CA2, and CA3 of the first input addresses in response to the first selection signal (or the fourth control signal) to deliver the third succession of the leading row address RA1 of the row addresses of the first input addresses and the column addresses CA1, CA2, and CA3 of the first input addresses to the memory device 20 as the output address signal.

A timing controller 14 serves as a signal producer and produces the first through the third address latch signals (or the first through the third control signals) LCH1 to LCH3 and the first selection signal (or the fourth control signal). The timing controller 14 further produces a second selection signal (or a fifth control signal) in response to the coincidence signal and deliver the second selection signal through the selection signal line SEL to the multiplexer 16.

The multiplexer (or the output address producer) 16 produces, in response to the second selection signal (or the fifth control signal), a fourth succession of the column addresses CA4, CA5, and CA6 (depicted along the fifth line ADOUT in FIG. 2) of the second input addresses. The multiplexer 16 delivers the fourth succession of the column addresses CA4, CA5, and CA6 of the second input addresses to the memory device 20 as the output address signal with the time interval left between the third succession of the leading row address RA1 of the row addresses of the first input addresses and the column addresses CA1, CA2, and CA3 and the fourth succession of the column addresses CA4, CA5, and CA6 of the second input addresses in the manner illustrated along the fifth line ADOUT in FIG. 2.

In FIG. 1, the timing controller 14 is supplied with a write command signal 40. The timing controller 10 further produces a row address strobe signal RAS, a column address strobe signal, and a write enable signal WE collectively as a timing signal and delivers the row address strobe signal RAS, the column address strobe signal CAS, and the write enable signal WE to the memory device 20. The timing controller 10 produces a read enable signal (not shown) instead of the write enable signal WE when the timing controller 10 receives a read command signal from the accessing device 30 instead of the write command signal 40. The row address strobe signal RAS, the column address strobe signal CAS, and the write enable signal WE are illustrated along sixth through eighth (or bottom) lines in FIG. 2.

In FIGS. 1 and 2, the row address strobe signal RAS, the column address strobe signal CAS, and the write enable signal WE has a negative logic (Low Active). The row address strobe signal RAS is for use in informing a determination timing of each row address in the output address signal to the memory device 20 by a trailing edge of the row address strobe signal RAS. The column address strobe signal CAS is for use in informing another determination timing of the column addresses in the output address signal to the memory device 20 by a trailing edge of the column address strobe signal CAS. The write enable signal WE is for use in a determination timing of writing data to the memory device 20 by a trailing edge of the write enable signal WE in the static column mode. In the high-speed page mode which will later be described, the determination timing of the writing data is informed by the use of the column address strobe signal CAS.

Each of the row address strobe signal RAS and the column address strobe signal CAS has an activated (or active) state during the time interval interposed between the third succession of the leading row address RA1 of the row addresses of the first input addresses and the column addresses CA1, CA2, and CA3 of the first input addresses and the fourth succession of the column addresses CA4, CA5, and CA6 of the second input addresses in the output address signal.

Figure 3:
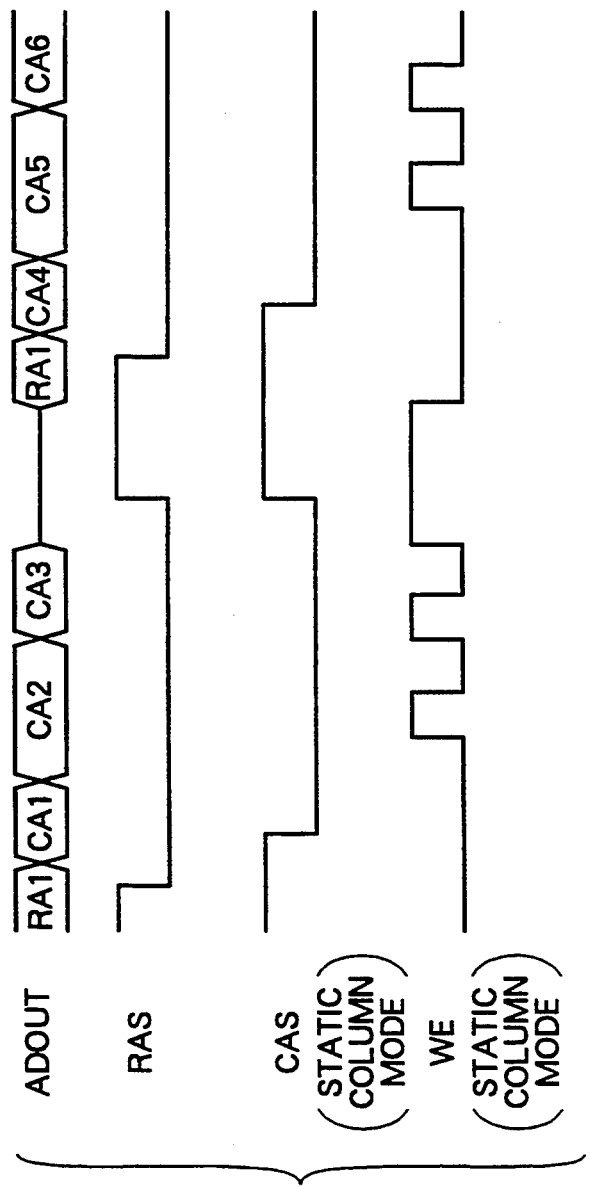
FIG. 3 is a time chart for use in describing operation of a conventional memory controller.

Turning to FIG. 3, operation of a conventional memory controller will now be described for a better understanding of this invention. As illustrated along a top or first line, the illustrated output address signal is produced when the conventional memory controller is supplied with the first succession of the first input addresses and supplied with the second succession of the second input addresses with the time interval left between the first succession of the first input addresses and the second succession of the second input addresses like the memory controller 10 of FIG. 1. That is, the conventional memory controller produces a specific succession of the leading row address RA1 of the row addresses of the second input addresses and the column addresses CA4, CA5, and CA6 of the second input addresses with the time interval left between the third succession of the leading row address RA1 of the row addresses of the first input addresses and the column addresses CA1, CA2, and CA3 and the specific succession of the leading row address RA1 of the row addresses of the second input addresses and the column addresses CA4, CA5, and CA6 of the second input addresses even when the leading row address RA1 of the row addresses of the second input addresses coincides with the leading row address RA1 of the row addresses of the first input addresses. Outputting of the leading row address RA1 of the row addresses of the second input addresses is time-consuming. Thus, the conventional memory controller can not access the memory device at a high speed when supplied with the input addresses with the time interval interposed between the input addresses having the same row address as described above. Each of the row address strobe signal RAS and the column address strobe signal CAS (the static column mode) inevitably has a non-activated state for the most part of the time interval left between the column address CA3 and the row address RA1.

Figure 4:
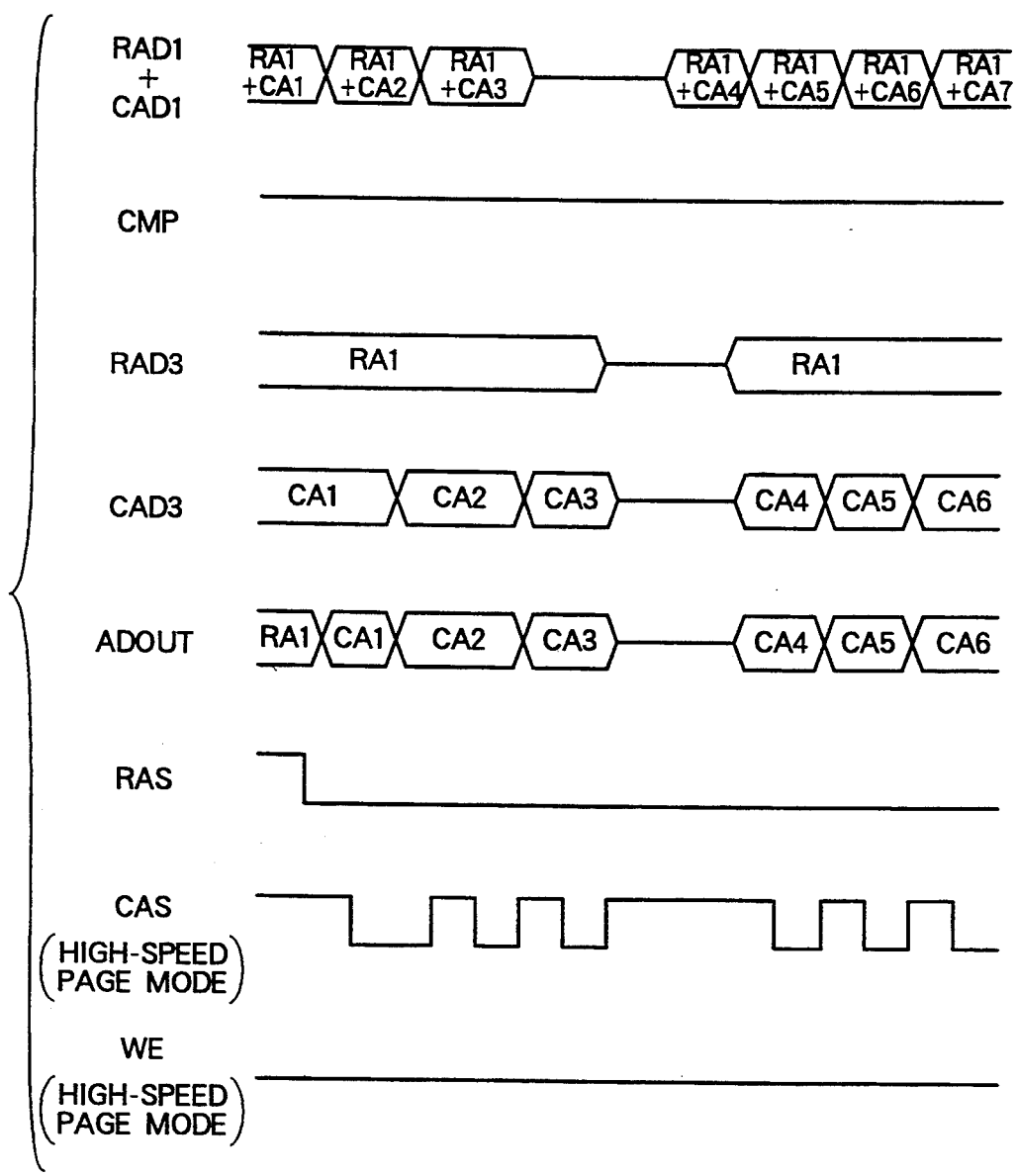
FIG. 4 is a time chart for use in describing another operation of the memory controller illustrated in FIG. 1.

Turning to FIG. 4, the timing controller 14 of the memory controller 10 of FIG. 1 produces the column address strobe signal CAS and the write enable signal WE at the high-speed page mode in the manner illustrated along seventh and eighth lines. Remaining parts are similar to those of FIG. 2.

Figure 5:
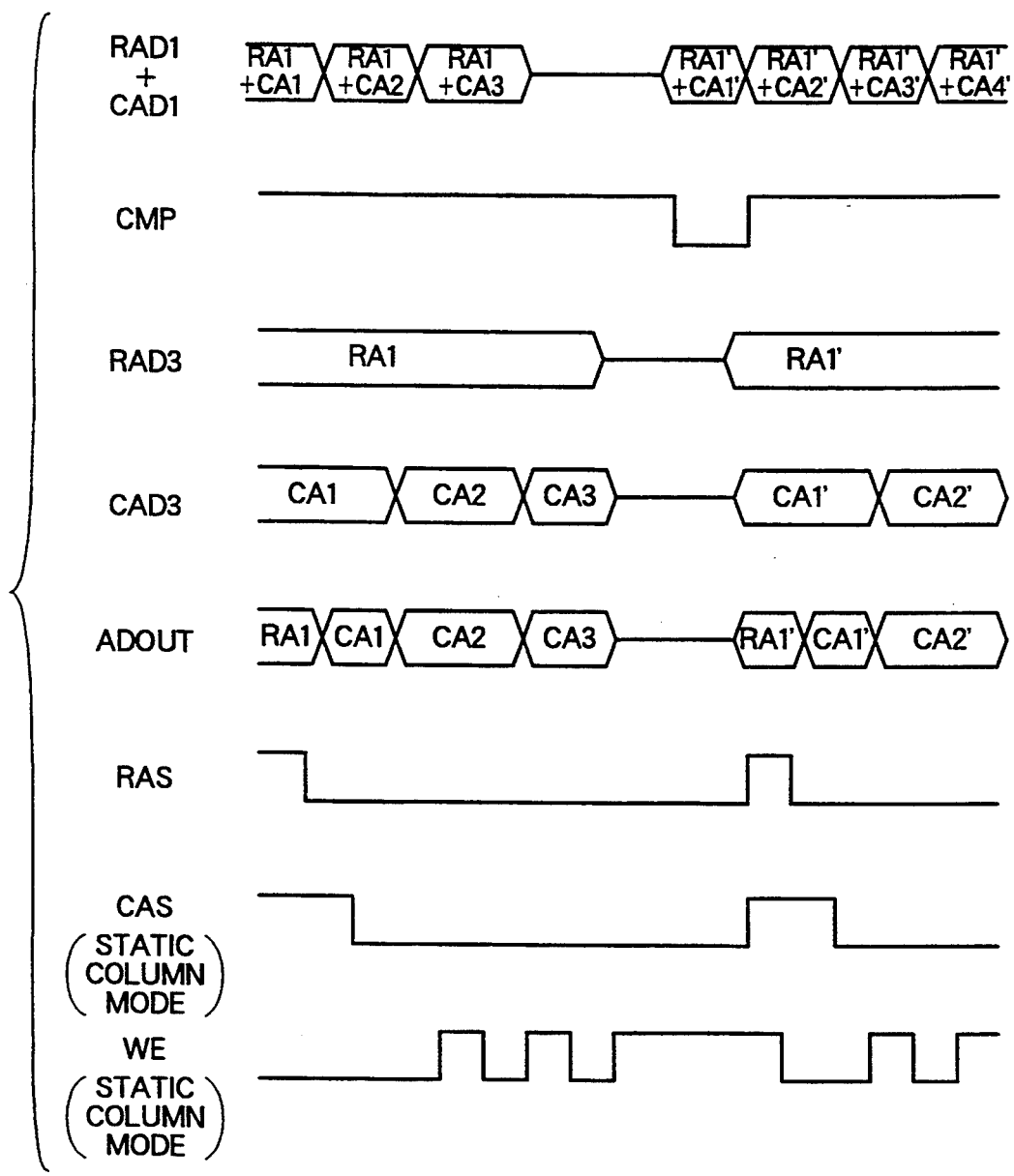
FIG. 5 is a time chart for use in describing still another operation of the memory controller illustrated in FIG. 1.

Referring to FIGS. 1 and 5, the coincidence detector (12 and 13) further detects non-coincidence between the trailing row address of the first input addresses RA1 of the first input addresses and the leading row address of the row addresses RA1′ of the second input addresses in response to the second address latch signal (or the second control signal) LCH2 and produces a non-coincidence signal of a low level as the compared result CMP when the coincidence detector (12 and 13) detects the non-coincidence. The non-coincidence signal is illustrated along a second line in FIG. 1 and has a low level.

The timing controller 14 produces, in response to the non-coincidence signal, a third selection signal (or a sixth control signal) and delivers the third selection signal through the selection signal line SEL to the multiplexer 16.

Attention will be directed to a fifth line ADOUT. The multiplexer 16 produces, in response to the third selection signal (or the sixth control signal), a fifth succession of the leading row address RA1' of the row addresses of the second input addresses and the column addresses CA1' and CA2' of the second input addresses to deliver the fifth succession of the leading row address RA1' of the row addresses of the second input addresses and the column addresses CA1' and CA2' of the second input addresses to the memory device 20 as the output address signal with the time interval left between the third succession of the leading row address RA1 of the row addresses of the first input addresses and the column addresses CA1, CA2, and CA3 of the first input addresses and the fifth succession of the leading row address RA1' of the row addresses of the second input addresses and the column addresses CA1' and CA2' of the second input addresses.

In FIG. 5, each of the row address strobe signal RAS and the column address strobe signal CAS (static column mode) has an activated (or active) state during the time interval interposed between the third succession of the leading row address RA1 of the row addresses of the first input addresses and the column addresses CA1, CA2, and CA3 of the first input addresses and the fifth succession of the leading row address RA1' of the row addresses of the second input addresses and the column addresses CA1' and CA2' of the second input addresses.

Figure 6:
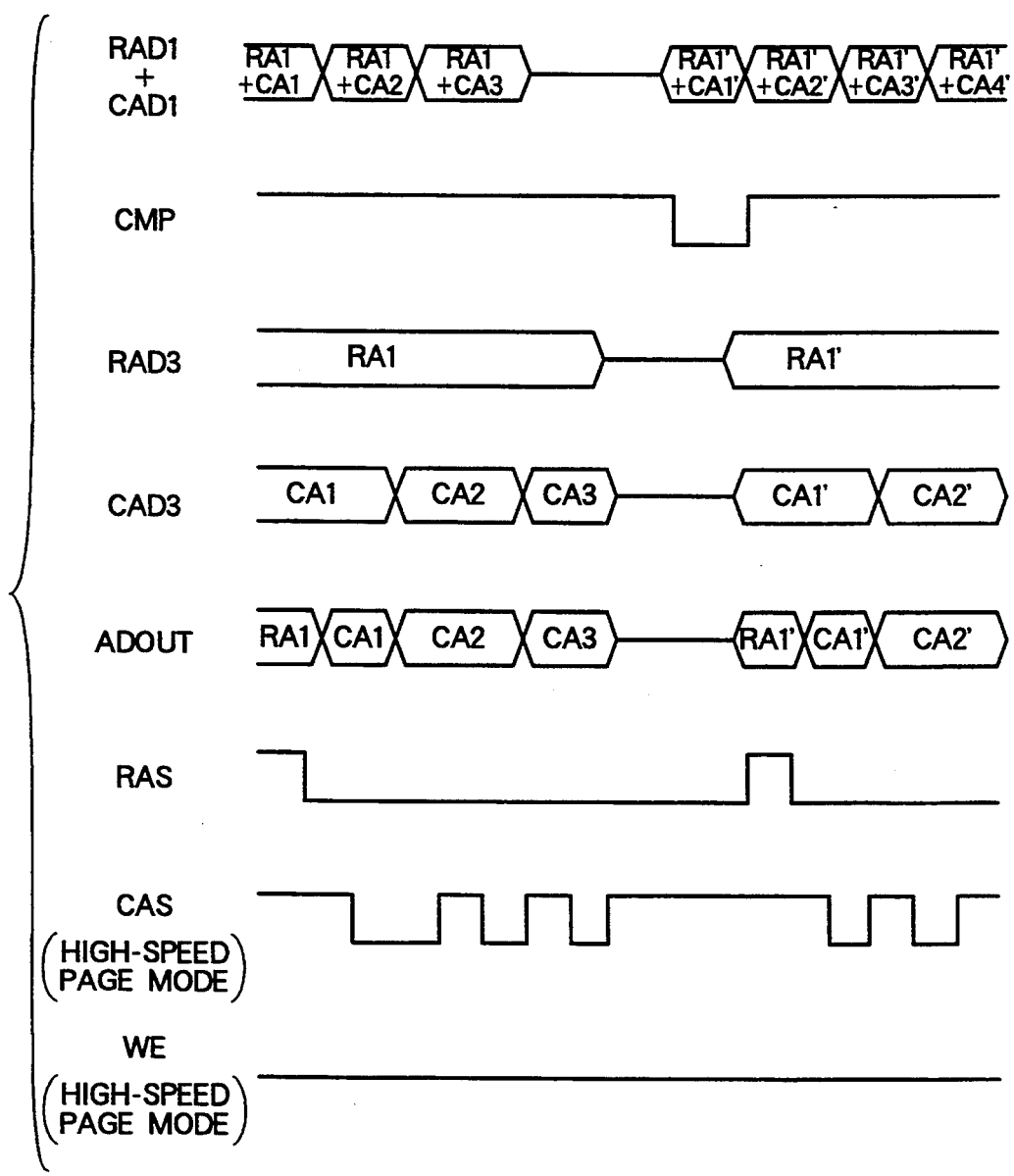
FIG. 6 is a time chart for use in describing a different operation of the memory controller illustrated in FIG. 1.

Turning to FIG. 6, the column address strobe signal CAS and the write enable signal WE are produced at the high-speed page mode in the manner illustrated along seventh and eighth lines. Remaining parts are similar to those of FIG. 5.

Figure 7:
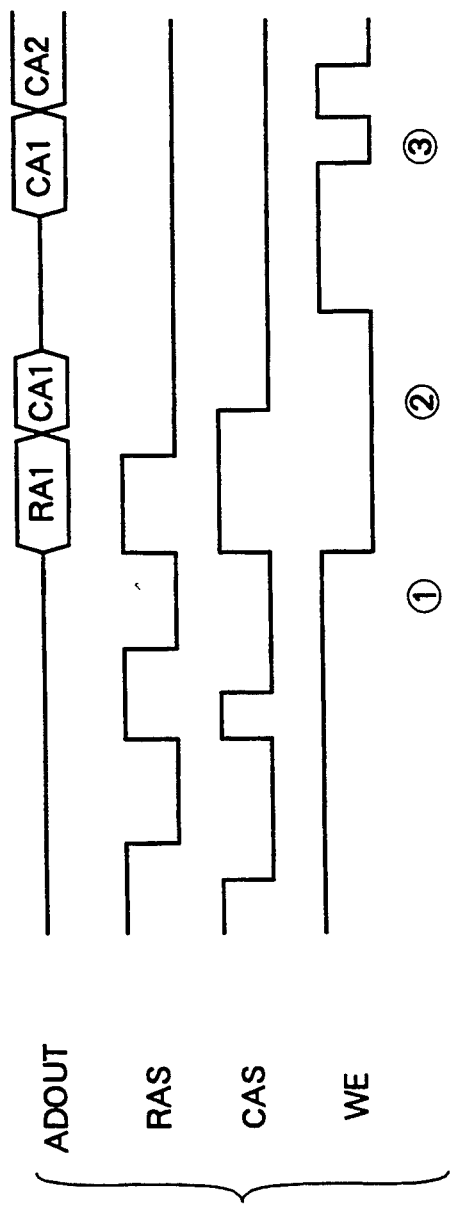
FIG. 7 is a time chart for use in describing a specific operation of the memory device illustrated in FIG. 1.

Turning to FIG. 7, description will proceed to operation of the memory controller 10 of FIG. 1 when the memory controller 10 comes to an end for refreshing operation of the memory device 20 (FIG. 1). The refreshing operation carries out by putting the column address strobe signal CAS into an activated state prior to the row address strobe signal RAS. A refreshing cycle is finished at a first time instant (1). At a second time instant (2), the memory controller 10 delivers a predictive row address RA1 and a predictive column address CA1 to the memory device 20 to write dummy data in the memory device 20 at a static column mode. At a third time instant (3), a memory access is again started at the static column mode for the same row address RA1 and another column address CA2. In this event, correct data are written in the same column address CA1 of the memory device 20. This results in reduction of an access time.

What is claimed is:

1. A memory controller supplied with a first succession of first input addresses and supplied with a second succession of second input addresses with a time interval left between said first succession of the first input addresses and said second succession of the second input addresses, each of said first and said second input addresses comprising a row address and a column address, the row addresses of said first input addresses being common in said first input addresses, the row addresses of said second input addresses being common in said second input addresses, said memory controller being for controlling a memory device in response to said first succession of the first input addresses and to said second succession of the second input addresses to access said memory device at a predetermined access mode, said memory controller comprising:

an address receiver for receiving said first succession of the first input addresses and said second succession of the second input addresses in response to a first control signal to successively produce said first input addresses and said second input addresses;

a coincidence detector connected to said address receiver for detecting coincidence between a trailing row address of the row addresses of said first input addresses and a leading row address of the row addresses of said second input addresses in response to a second control signal to produce a coincidence signal when said coincidence detector detects said coincidence;

an address latch unit connected to said address receiver for temporarily storing said first input addresses and said second input addresses in response to a third control signal to successively produce said first input addresses and said second input addresses;

an output address producer connected to said address latch unit for producing a third succession of a leading row address of the row addresses of said first input addresses and the column addresses of said first input addresses in response to a fourth control signal to deliver said third succession of the leading row address of the row addresses of said first input addresses and the column addresses of said first input addresses to said memory device as an output address signal; and a signal producer connected to said coincidence detector for producing said first through said fourth control signals and for producing, in response to said coincidence signal, a fifth control signal;

said output address producer producing, in response to said fifth control signal, a fourth succession of the column addresses of said second input addresses to deliver said fourth succession of the column addresses of said second input addresses to said memory device as said output address signal with said time interval left between said third succession of the leading row address of the row addresses of said first input addresses and the column addresses of said first input addresses and said fourth succession of the column addresses of said second input addresses.

2. A memory controller as claimed in claim 1, wherein said signal producer further produces a row address strobe signal having an activated state during said time interval left between said third succession of the leading row address of the row addresses of said first input addresses and the column addresses of said first input addresses and said fourth succession of the column addresses of said second input addresses.

3. A memory controller as claimed in claim 2, wherein said predetermined access mode is a high-speed page mode.

4. A memory controller as claimed in claim 2, wherein said predetermined access mode is a static column mode.

5. A memory controller as claimed in claim 4, wherein said signal producer further produces a column address strobe signal having an activated state during said time interval left between said third succession of the leading row address of the row addresses of said first input addresses and the column addresses of said first input addresses and said fourth succession of the column addresses of said second input addresses.

6. A memory controller as claimed in claim 1, wherein:
   said coincidence detector further detects non-coincidence between the trailing row address of the row addresses of said first input addresses and the leading row addresses of the row addresses of said second input addresses in response to said second control signal to produce a non-coincidence signal when said coincidence detector detects said non-coincidence;
   said signal producer producing, in response to said non-coincidence signal, a sixth control signal;
   said output address producer producing, in response to said sixth control signal, a fifth succession of the leading row address of the row addresses of said second input addresses and the column addresses of said second input addresses to deliver said fifth succession of the leading row address of the row addresses of said second input addresses and the column addresses of said second input addresses to said memory device as said output address signal with said time interval left between said third succession of the leading row address of the row addresses of said first input addresses and the column addresses of said first input addresses and said fifth succession of the leading row address of the row addresses of said second input addresses and the column addresses of said second input addresses.

7. A memory controller as claimed in claim 6, wherein said signal producer further produces a row address strobe signal having an activated state during said time interval left between said third succession of the leading row address of the row addresses of said first input addresses and the column addresses of said first input addresses and said fifth succession of the leading row address of the row addresses of said second input addresses and the column addresses of said second input addresses.

8. A memory controller as claimed in claim 7, wherein said predetermined access mode is a high-speed page mode.

9. A memory controller as claimed in claim 7, wherein said predetermined access mode is a static column mode.

10. A memory controller as claimed in claim 9, wherein said signal producer further produces a column address strobe signal having an activated state during said time interval left between said third succession of the leading row address of the row addresses of said first input addresses and the column addresses of said first input addresses and said fifth succession of the leading row address of the row addresses of said second input addresses and the column addresses of said second input addresses.

11. A memory controller supplied with a first succession of first input addresses and supplied with a second input address with a time interval left between said first succession of the first input addresses and said second input address, each of said first and said second input addresses comprising a row address and a column address, the row addresses of said first input addresses being common in said first input addresses, said memory controller being for controlling a memory device in response to said first succession of the first input addresses and to said second input address to access said memory device at a predetermined access mode, said memory controller comprising:
   an address receiver for receiving said first succession of the first input addresses and said second input address in response to a first control signal to successively produce said first input addressees and said second input address;
   a coincidence detector connected to said address receiver for detecting coincidence between a trailing row address of the row addresses of said first input addresses and the row address of said second input address in response to a second control signal to produce a coincidence signal when said coincidence detector detects said coincidence;
   an address latch unit connected to said address receiver for temporarily storing said first input addresses and said second input address in response to a third control signal to successively produce said first input addresses and said second input address;
   an output address producer connected to said address latch unit for producing a third succession of a leading row address of the row addresses of said first input addresses and the column addresses of said first input addresses in response to a fourth control signal to deliver said third succession of the leading row address of the row addresses of said first input addresses and the column addresses of said first input addresses to said memory device as an output address signal; and
   a signal producer connected to said coincidence detector for producing said first through said fourth control signals and for producing, in response to said coincidence signal, a fifth control signal;
   said output address producer producing, in response to said fifth control signal, the column address of said second input address to deliver the column address of said second input address to said memory device as said output address signal with said time interval left between said third succession of the leading row address of the row addresses of said first input addresses and the column addresses of said first input addresses and the column address of said second input address.

12. A memory controller as claimed in claim 11, wherein said signal producer further produces a row address strobe signal having an activated state during said time interval left between said third succession of the leading row address of the row addresses of said first input addresses and the column addresses of said first input addresses and the column address of said second input address.

13. A memory controller as claimed in claim 12, wherein said predetermined access mode is a high-speed page mode.

14. A memory controller as claimed in claim 12, wherein said predetermined access mode is a static column mode.

15. A memory controller as claimed in claim 14, wherein said signal producer further produces a column address strobe signal having an activated state during said time interval left between said third succession of the leading row address of the row addresses of said first input addresses and the column addresses of said first input addresses and the column address of said second input address.

16. A memory controller as claimed in claim 11, wherein:
said coincidence detector further detects non-coincidence between the trailing row address of the row addresses of said first input addresses and the row address of said second input address in response to said second control signal to produce a non-coincidence signal when said coincidence detector detects said non-coincidence;
said signal producer producing, in response to said non-coincidence signal, a sixth control signal,
said output address producer producing, in response to said sixth control signal, a different succession of the row address of said second input address and the column address of said second input address to deliver said different succession of the row address of said second input address and the column address of said second input address to said memory device as said output address signal with said time interval left between said third succession of the leading row address of the row addresses of said first input addresses and the column addresses of said first input addresses and said different succession of the row address of said second input address and the column address of said second input address.

17. A memory controller as claimed in claim 16, wherein said signal producer further produces a row address strobe signal having an activated state during said time interval left between said third succession of the leading row address of the row addresses of said first input addresses and the column addresses of said first input addresses and said different succession of the row address of said second input address and the column address of said second input address.

18. A memory controller as claimed in claim 17, wherein said predetermined access mode is a high-speed page mode.

19. A memory controller as claimed in claim 17, wherein said predetermined access mode is a static column mode.

20. A memory controller as claimed in claim 19, wherein said signal producer further produces a column address strobe signal having an activated state during said time interval left between said third succession of the leading row address of the row addresses of said first input addresses and the column addresses of said first input addresses and said different succession of the row address of said second input address and the column address of said second input address.

* * * * *